(12) United States Patent
Feng

(10) Patent No.: US 11,881,854 B2
(45) Date of Patent: Jan. 23, 2024

(54) LEVEL SHIFTER CIRCUIT OF DRIVING DEVICE

(71) Applicant: uPI Semiconductor Corp., Hsinchu County (TW)

(72) Inventor: Shao-Lin Feng, Hsinchu County (TW)

(73) Assignee: uPI Semiconductor Corp., Hsinchu County (TW)

( * ) Notice: Subject to any disclaimer, the term of this patent is extended or adjusted under 35 U.S.C. 154(b) by 0 days.

(21) Appl. No.: 18/163,273

(22) Filed: Feb. 1, 2023

(65) Prior Publication Data

US 2023/0261658 A1    Aug. 17, 2023

(30) Foreign Application Priority Data

Feb. 14, 2022  (CN) .......................... 202210133700.2

(51) Int. Cl.
| | |
|---|---|
| H03K 19/0185 | (2006.01) |
| H03K 3/037 | (2006.01) |
| H03K 19/20 | (2006.01) |
| H03K 5/01 | (2006.01) |
| H03K 5/00 | (2006.01) |
| H03K 3/017 | (2006.01) |

(52) U.S. Cl.
CPC ..... *H03K 19/018507* (2013.01); *H03K 3/037* (2013.01); *H03K 19/20* (2013.01); *H03K 3/017* (2013.01); *H03K 5/01* (2013.01); *H03K 2005/00013* (2013.01)

(58) Field of Classification Search
CPC ........... H03K 19/018507; H03K 3/037; H03K 19/20; H03K 3/017; H03K 5/01; H03K 2005/00013

USPC ........................................................ 327/333
See application file for complete search history.

(56) References Cited

U.S. PATENT DOCUMENTS

| | | | | |
|---|---|---|---|---|
| 4,450,371 | A  * | 5/1984 | Bismarck | ............... H03K 5/151 |
| | | | | 326/17 |
| 5,903,142 | A | 5/1999 | Mann | |
| 7,728,628 | B2 * | 6/2010 | Chiang | .................. H03K 3/012 |
| | | | | 327/333 |
| 7,956,642 | B2 * | 6/2011 | Lee | .................. H03K 3/356113 |
| | | | | 327/333 |
| 10,270,448 | B1 * | 4/2019 | Blutman | ........ H03K 19/018514 |

(Continued)

FOREIGN PATENT DOCUMENTS

| | | |
|---|---|---|
| CN | 108768145 | 7/2019 |
| CN | 109905111 | 6/2020 |

*Primary Examiner* — Ryan Jager
(74) *Attorney, Agent, or Firm* — JCIPRNET

(57) ABSTRACT

A level shifter circuit of a driving device includes first and second pulse generators, first and second level shifters, and a determination circuit. The first pulse generator provides a first input signal according to a high-voltage signal. The first input signal includes a pulse signal having a first current level and a sustain signal having a second current level following the pulse signal. The first level shifter receives the first input signal to generate a first indication signal. The second pulse generator provides a second input signal according to the high-voltage signal. The second input signal includes the pulse signal and the sustain signal following the pulse signal. The second level shifter receives the second input signal to generate a second indication signal. The determination circuit generates a low-voltage signal according to the first indication signal and the second indication signal.

10 Claims, 4 Drawing Sheets

(56) References Cited

U.S. PATENT DOCUMENTS

| | | | |
|---|---|---|---|
| 10,862,463 B1* | 12/2020 | Zhou | H03K 3/356182 |
| 2010/0156498 A1 | 6/2010 | Bagepalli | |
| 2023/0261658 A1* | 8/2023 | Feng | H03K 19/018507 |
| | | | 327/333 |

* cited by examiner

LEVEL SHIFTER CIRCUIT OF DRIVING DEVICE

CROSS-REFERENCE TO RELATED APPLICATION

This application claims the priority benefit of Chinese application no. 202210133700.2, filed on Feb. 14, 2022. The entirety of the above-mentioned patent application is hereby incorporated by reference herein and made a part of this specification.

BACKGROUND

Technical Field

The disclosure relates to a level shifter circuit. In particular, the disclosure relates to a level shifter circuit of a driving device of a power switch in a power conversion device.

Description of Related Art

With reference to FIG. 1, FIG. 1 is a schematic block diagram of a conventional driving device. A logic unit 110 generates a logic output signal OUT to a driving signal level shifter circuit 121 according to pulse width modulation signals PWM_H and PWM_L. The driving signal level shifter circuit 121 may convert the logic output signal OUT from a low voltage domain into a high voltage domain, for a first driver 131 to accordingly generate a driving signal UG in a high voltage domain to drive a high-side power switch (not shown). A second driver 132 may generate a driving signal LG in a low voltage domain according to the output signal of the logic unit 110 to drive a low-side power switch (not shown). A level shifter circuit 122 may obtain a high-voltage signal HV_IN according to an output of the first driver 131, convert the high-voltage signal HV_IN into a low-voltage signal LV_OUT, and provide the low-voltage signal LV_OUT to the logic unit 110.

With reference to FIG. 2, FIG. 2 is a schematic conventional circuit diagram of the level shifter circuit 122 in FIG. 1. A high-voltage transistor 201 receives the high-voltage signal HV_IN, and outputs the low-voltage signal LV_OUT. In the application of a power conversion device system, a high-voltage ground signal HV_GND is the output node voltage of the power conversion device, and may switch between the working voltage and the ground voltage. When the high-voltage ground signal HV_GND rises, parasitic capacitance 202 between a control terminal and a second terminal of the high-voltage transistor 201 may transmit currents I_C to a circuit node N1, and the voltage level of the low-voltage output signal LV_OUT may be pulled up synchronously. In the application of high-speed switching, this phenomenon may causes erroneous determination by the logic unit 110.

SUMMARY

The disclosure is directed to a level shifter circuit of a driving device, which effectively prevents erroneous output determination caused by changes in a high-voltage ground signal and a high-voltage power.

According to an embodiment of the disclosure, a level shifter circuit of a driving device is configured to convert a high-voltage signal into a low-voltage signal. The level shifter circuit includes a first pulse generator, a first level shifter, a second pulse generator, a second level shifter, and a determination circuit. The first pulse generator provides a first input signal according to the high-voltage signal. The first input signal includes a pulse signal having a first current level and a sustain signal following the pulse signal and having a second current level. The first current level is higher than the second current level. The first level shifter is coupled to the first pulse generator. The first level shifter receives the first input signal to generate a first indication signal. The second pulse generator provides a second input signal according to the high-voltage signal. The second input signal includes the pulse signal and the sustain signal following the pulse signal. The second level shifter is coupled to the second pulse generator. The second level shifter receives the second input signal to generate a second indication signal. The determination circuit is coupled to the first level shifter and the second level shifter. The determination circuit generates the low-voltage signal according to the first indication signal and the second indication signal.

In an embodiment, the pulse signal and the sustain signal of the first input signal occur during a period corresponding to when the high-voltage signal is at a high voltage level.

In an embodiment, the pulse signal and the sustain signal of the second input signal occur during a period corresponding to when the high-voltage signal is at a low voltage level.

In an embodiment, the first current level is ten times or more higher than the second current level.

In an embodiment, a duration of the pulse signal of the first input signal and the second input signal is 10% to 20% of a time length of a duty cycle of the high-voltage signal.

In an embodiment, the sustain signal of the first input signal is cut off according to a falling edge of the high-voltage signal, and the sustain signal of the second input signal is cut off according to a rising edge of the high-voltage signal.

In an embodiment, the determination circuit includes a latch circuit and a determination logic. The latch circuit is coupled to the first level shifter and the second level shifter. The latch circuit generates a first square-wave signal and a second square-wave signal according to the first indication signal and the second indication signal. The determination logic is coupled to the latch circuit. The determination logic generates the low-voltage output signal according to the first square-wave signal and the second square-wave signal.

In an embodiment, the level shifter circuit further includes a diode. A first terminal of the diode is coupled to the latch circuit. A second terminal of the diode is coupled to the second level shifter.

In an embodiment, the determination logic includes a logic gate and a latch control circuit. The logic gate receives the first square-wave signal and the second square-wave signal, and accordingly generates a block signal. The latch control circuit generates the low-voltage signal according to the first square-wave signal, the second square-wave signal, and the block signal.

In an embodiment, the determination logic further includes a first delay circuit and a second delay circuit. The first delay circuit and the second delay circuit respectively receive the first square-wave signal and the second square-wave signal and generate a delayed first square-wave signal and a delayed second square-wave signal. The determination logic generates the low-voltage signal according to the delayed first square-wave signal and the delayed second square-wave signal.

In an embodiment of the disclosure, the driving device receives a pulse width modulation signal and generates a driving signal. The driving device further includes a logic unit, a driving signal level shifter circuit, a first driver, and the level shifter circuit. The logic unit receives the pulse width modulation signal and generates a logic output signal. The driving signal level shifter circuit is coupled to the logic unit. The driving signal level shifter circuit receives the logic output signal and converts the logic output signal from a low voltage domain into a high voltage domain. The first driver is coupled to the driving signal level shifter circuit. The first driver generates the driving signal according to the logic output signal in the high voltage domain. The level shifter circuit is coupled between the first driver and the logic unit. The level shifter circuit obtains the high-voltage signal according to the driving signal and converts the high-voltage signal into the low-voltage signal.

Based on the foregoing, according to the embodiments of the disclosure, the level shifter circuit of the driving device may generate input signals including a pulse signal and a sustain signal having a low current level according to the high-voltage signal, and generate corresponding indication signals according to the input signals for the determination circuit to accordingly generate a correct and stable low-voltage signal, without being affected by changes in the high-voltage ground signal and/or the high-voltage power.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
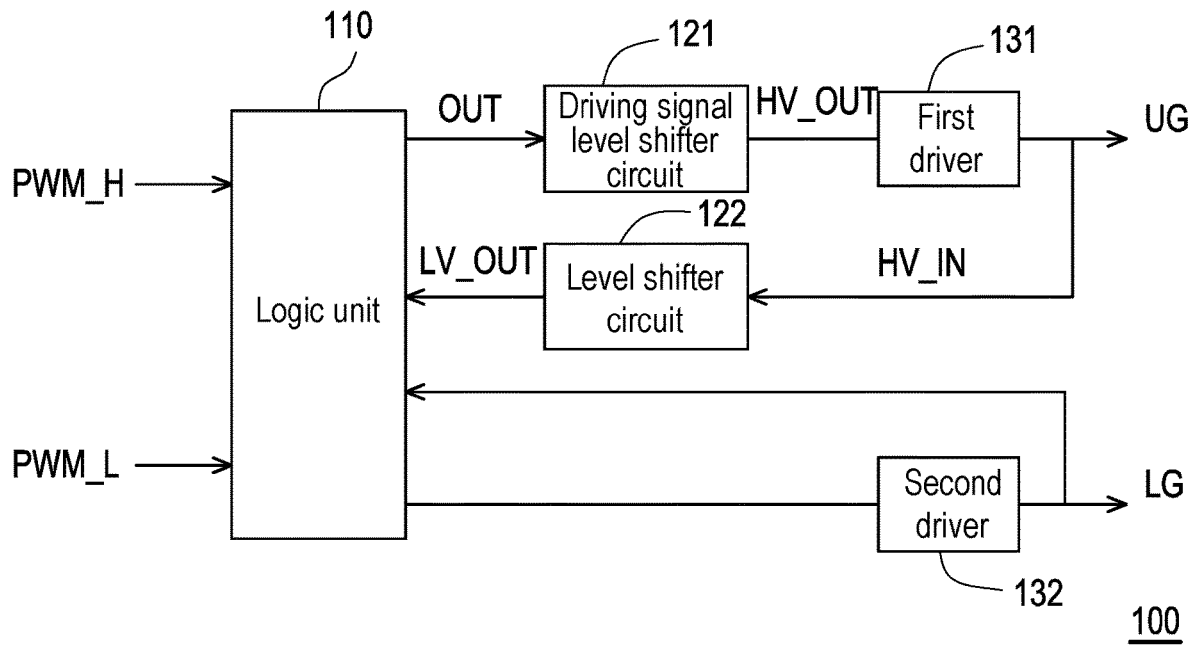
FIG. 1 is a schematic block diagram of a conventional driving device.
Figure 2:
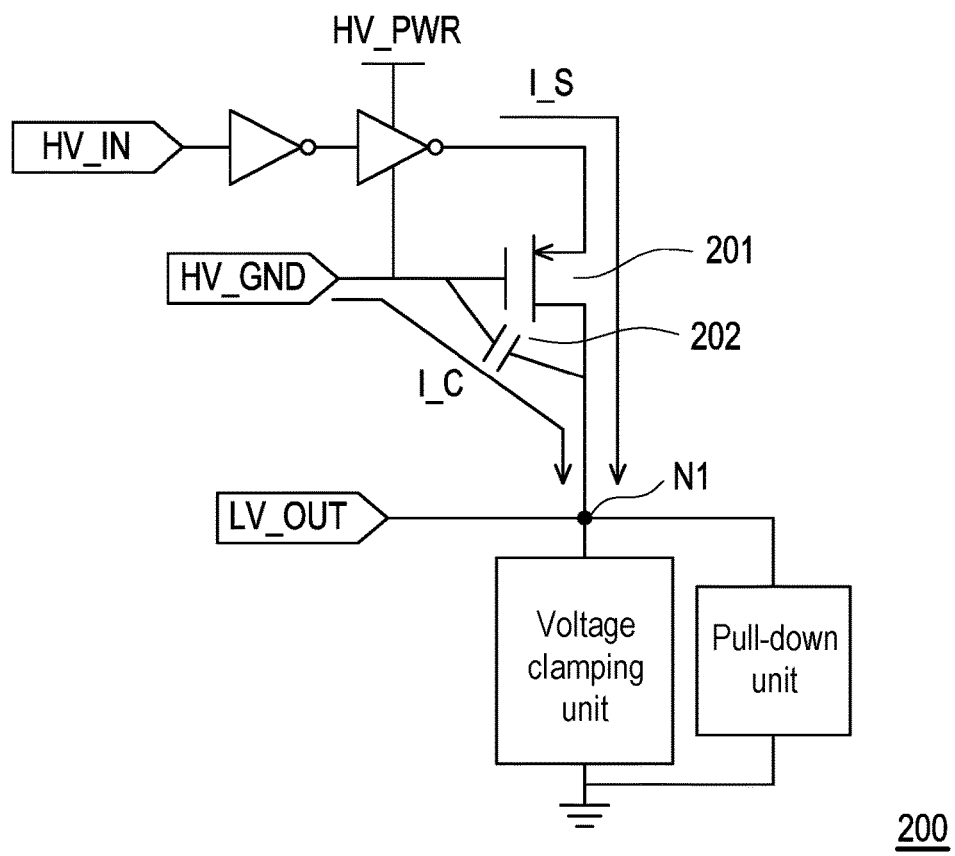
FIG. 2 is a schematic conventional circuit diagram of the level shifter circuit in FIG. 1.

Reference will now be made in detail to the exemplary embodiments of the disclosure, examples of which are illustrated in the accompanying drawings. Wherever possible, the same reference numerals are used in the drawings and descriptions to refer to the same or like parts.

Figure 3:
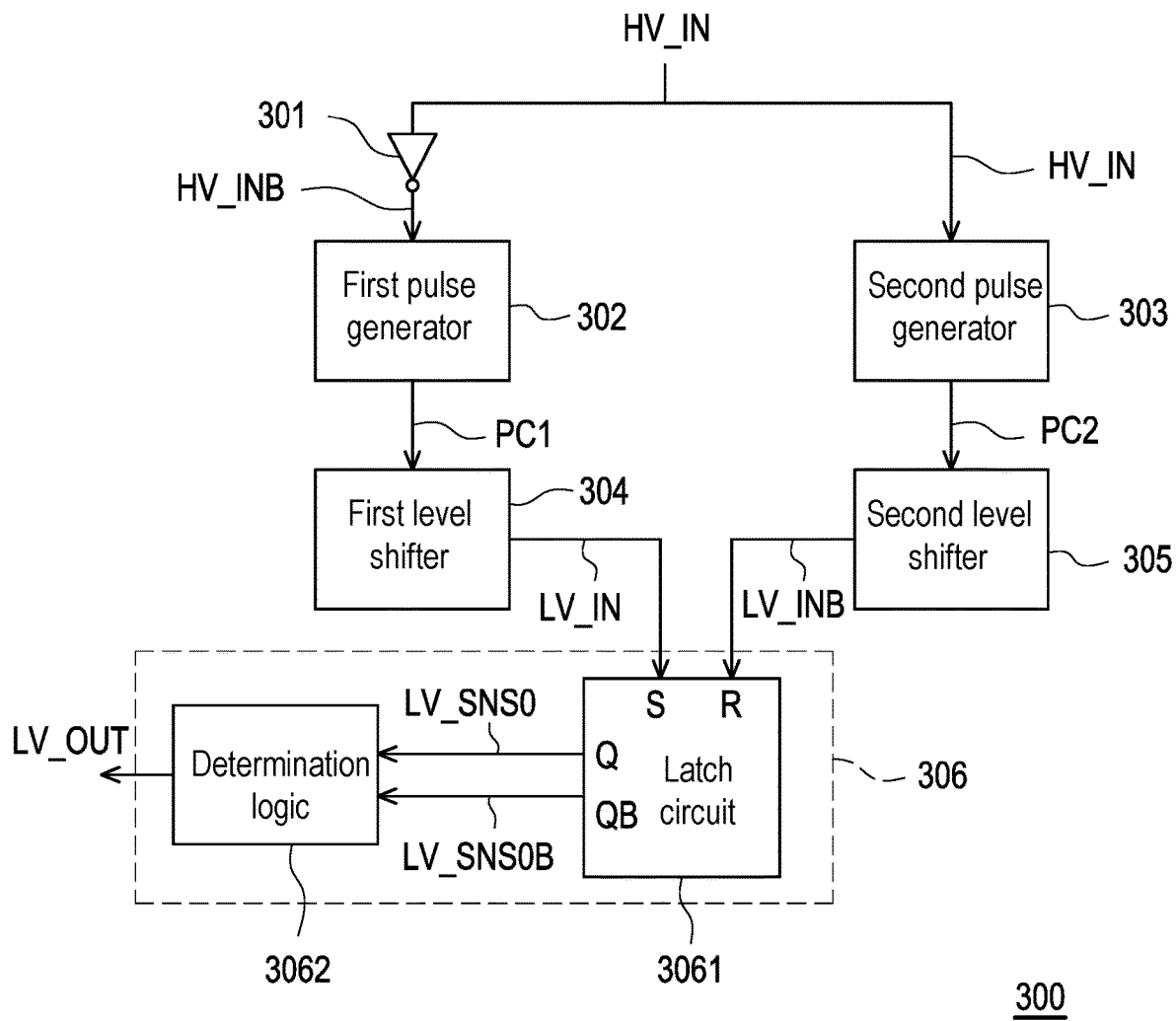
FIG. 3 is a schematic block diagram of a level shifter circuit of an embodiment of the disclosure.

FIG. 3 is a schematic block diagram of a level shifter circuit of an embodiment of the disclosure. With reference to FIG. 1 and FIG. 3, in an embodiment of the disclosure, a driving device includes the logic unit 110, the first driver 131, and the level shifter circuit 122 of FIG. 1, and includes a level shifter circuit 300 of FIG. 3. It should be noted that, in the driving device of the embodiment of the disclosure, the specific internal circuits of the level shifter circuit 122 in FIG. 1 is realized by the level shifter circuit 300 in FIG. 3. With reference to FIG. 1, the logic unit 110 receives the pulse width modulation signal PWM_H/PWM_L and generates the logic output signal OUT. The driving signal level shifter circuit 121 is coupled to the logic unit 110, receives the logic output signal OUT, and converts the logic output signal OUT from a low voltage domain into a high voltage domain. The first driver 131 is coupled to the driving signal level shifter circuit 121 and generates the driving signal UG according to the output signal HV_OUT in a high voltage domain. The level shifter circuit 122 is coupled between the first driver 131 and the logic unit 110, obtains the high-voltage signal HV_IN according to the driving signal UG, and converts the high-voltage signal HV_IN into the low-voltage signal LV_OUT.

With reference to FIG. 3, the level shifter circuit 300 is adapted to a driving device. The level shifter circuit 300 includes an inverter 301, a first pulse generator 302, a second pulse generator 303, a first level shifter 304, a second level shifter 305, and a determination circuit 306. An input terminal of the inverter 301 receives the high-voltage signal HV_IN, and an output terminal of the inverter 301 may output an inverted high-voltage signal HV_INB. The output terminal of the inverter 301 is coupled to the first pulse generator 302. The second pulse generator 303 receives the high-voltage signal HV_IN. In this embodiment, the first pulse generator 302 may provide a first input signal PC1 according to rising edge triggering of the high-voltage signal HV_IN. The first level shifter 304 is coupled to the first pulse generator 302, and may receive the first input signal PC1 to generate a first indication signal LV_IN. The second pulse generator 303 may provide a second input signal PC2 according to falling edge triggering of the high-voltage signal HV_IN. The second level shifter 305 is coupled to the second pulse generator 303, and may receive the second input signal PC2 to generate a second indication signal LV_INB. The determination circuit 306 is coupled to the first level shifter 304 and the second level shifter 305, and may generate the low-voltage signal LV_OUT according to the first indication signal LV_IN and the second indication signal LV_INB.

In this embodiment, the determination circuit 306 includes a latch circuit 3061 and a determination logic 3062. A set terminal (S) of the latch circuit 3061 is coupled to the first level shifter 304, and a reset terminal (R) of the latch circuit 3061 is coupled to the second level shifter 305. The latch circuit 3061 may output a first square-wave signal LV_SNS0 and a second square-wave signal LV_SNS0B from an output terminal (Q) and a complementary output terminal (QB) according to the first indication signal LV_IN and the second indication signal LV_INB. The determination logic 3062 is coupled to the output terminal (Q) and the complementary output terminal (QB) of the latch circuit 3061. The determination logic 3062 may generate the low-voltage signal LV_OUT according to the first square-wave signal LV_SNS0 and the second square-wave signal LV_SNS0B.

Figure 4:
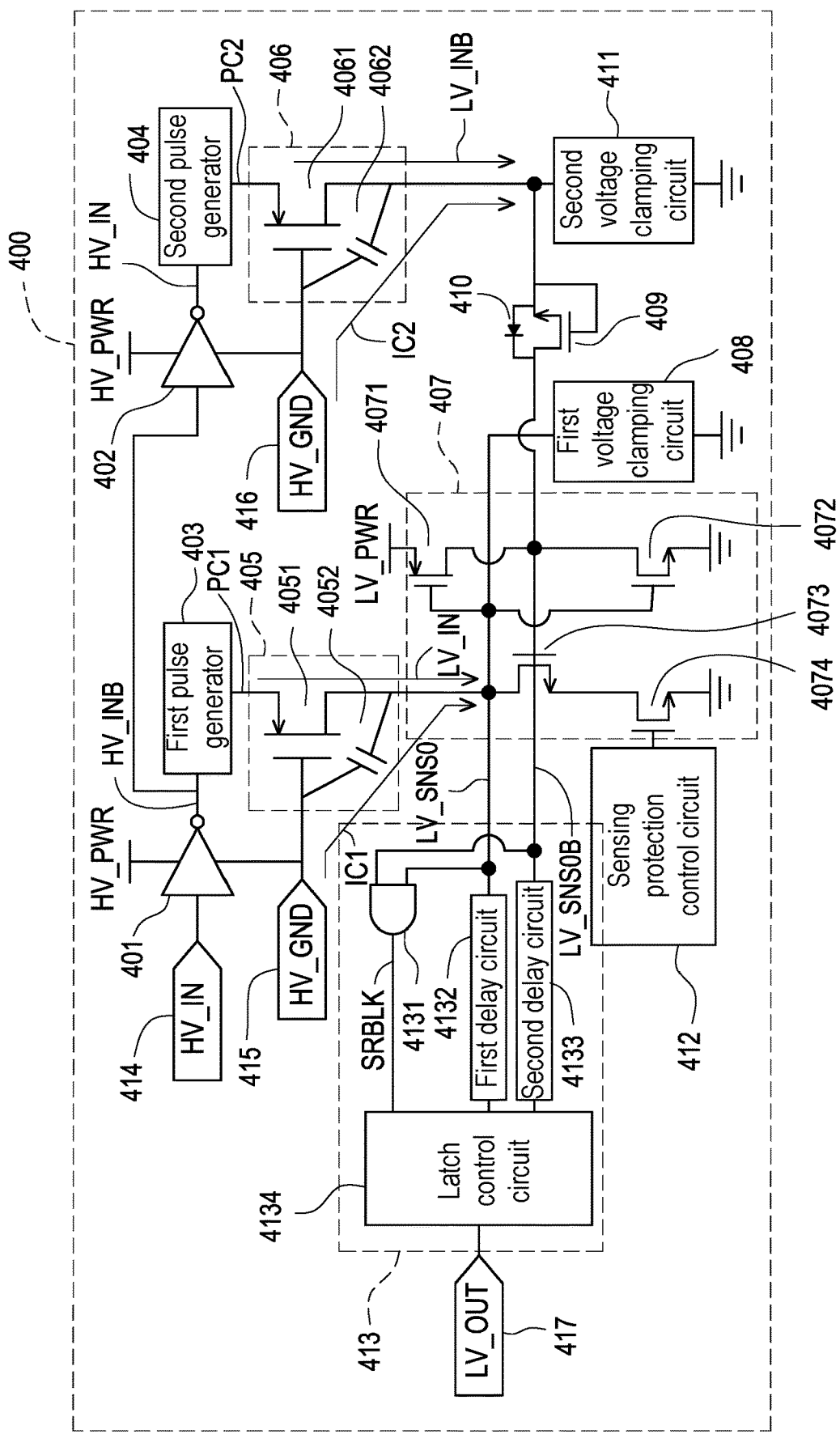
FIG. 4 is a schematic circuit diagram of a level shifter circuit of an embodiment of the disclosure.

FIG. 4 is a schematic circuit diagram of a level shifter circuit of an embodiment of the disclosure. With reference to FIG. 4, a level shifter circuit 400 in FIG. 4 may be a specific example of circuit implementation for the level shifter circuit 300 in FIG. 3 above. In this embodiment, an input terminal of a first inverter 401 is coupled to a high-voltage input terminal 414 to receive the high-voltage signal HV_IN. An output terminal of the first inverter 401 is coupled to a first pulse generator 403 to provide the inverted high-voltage signal HV_INB to the first pulse generator 403. An input terminal of a second inverter 402 is coupled to the output terminal of the first inverter 401 to receive the inverted high-voltage signal HV_INB. An output terminal of the second inverter 402 is coupled to a second pulse generator 404 to provide the high-voltage signal HV_IN to the second pulse generator 404.

In this embodiment, the first pulse generator 403 is coupled to a first level shifter 405. The first pulse generator 403 provides the first input signal PC1 to the first level shifter 405 according to rising edge triggering of the high-voltage signal HV_IN. The second pulse generator 404 is coupled to a second level shifter 406. The second pulse generator 404 provides the second input signal PC2 to the second level shifter 406 according to falling edge triggering of the high-voltage signal HV_IN. In this embodiment, the first level shifter 405 includes a high-voltage P-type transistor 4051. For example, the high-voltage P-type transistor 4051 may be a high-voltage P-type metal-oxide-semiconductor field-effect transistor (MOSFET). A first terminal of the high-voltage P-type transistor 4051 is coupled to the first pulse generator 403. A control terminal of the high-voltage P-type transistor 4051 is coupled to a high-voltage ground terminal 415. A second terminal of the high-voltage P-type transistor 4051 is coupled to a latch circuit 407. The second level shifter 406 includes a high-voltage P-type transistor 4061. For example, the high-voltage P-type transistor 4061 may be a high-voltage P-type MOSFET. A first terminal of the high-voltage P-type transistor 4061 is coupled to the second pulse generator 404. A control terminal of the high-voltage P-type transistor 4061 is coupled to a high-voltage ground terminal 416. A second terminal of the high-voltage P-type transistor 4061 is coupled to a transistor 409, a diode 410, and a second voltage clamping circuit 411. The diode 410 is a body diode of the transistor 409, for preventing reverse current flows when the high-voltage ground terminal HV_GND is at an excessively low voltage. In particular, in applications of a gallium nitride (GaN) transistor as a power switch, the voltage of the high-voltage ground terminal HV_GND is particularly likely to drop to a negative voltage and cause current reverse current flows. The transistor 409 may be a P-type transistor. An anode of the diode 410 is coupled to the latch circuit 407. A cathode of the diode 410 is coupled to a second terminal of the transistor 409, the second terminal of the high-voltage P-type transistor 4061, and the second voltage clamping circuit 411. In other words, a first terminal of the diode 410 is coupled to the latch circuit 3061, and a second terminal of the diode 410 is coupled to the second level shifter 305.

The latch circuit 407 includes transistors 4071 to 4074. The transistor 4071 may be a P-type transistor, and the transistors 4072 to 4074 may be N-type transistors. A first terminal of the transistor 4071 is coupled to a power supply voltage LV_PWR. A control terminal of the transistor 4071 is coupled to the second terminal of the high-voltage P-type transistor 4051 of the first level shifter 405 and receives the first indication signal LV_IN output by the second terminal of the high-voltage P-type transistor 4051. A second terminal of the transistor 4071 is coupled to the second level shifter 406 through the diode 410 and receives the second indication signal LV_INB output by the second terminal of the high-voltage P-type transistor 4061. A first terminal of the transistor 4072 is coupled to the second terminal of the transistor 4071 and receives the second indication signal LV_INB output by the second terminal of the high-voltage P-type transistor 4061. A control terminal of the transistor 4072 is coupled to the control terminal of the transistor 4071 and receives the first indication signal LV_IN. A second terminal of the transistor 4072 is coupled to the ground voltage. A first terminal of the transistor 4073 is coupled to the control terminal of the transistor 4071 and receives the first indication signal LV_IN. A control terminal of the transistor 4073 is coupled to the second terminal of the transistor 4071 and receives the second indication signal LV_INB output by the second terminal of the high-voltage P-type transistor 4061. A first terminal of the transistor 4074 is coupled to a second terminal of the transistor 4073. A second terminal of the transistor 4074 is coupled to the ground voltage. A control terminal of the transistor 4074 is coupled to a sensing protection control circuit 412. The control terminal of the transistor 4071 and the control terminal of the transistor 4072 are coupled to a first voltage clamping circuit 408. It should be noted that, in an embodiment, the area of the transistor 4073 may be greater than the area of the transistor 4072 to provide a greater pull-down current. In the case that drive currents exist at the control terminals of both transistors, the transistor 4073 is turned on prior to the transistor 4072 to function as a latch.

In this embodiment, the input signals PC1 and PC2 generated by the pulse generators 403 and 404 are current signals. The current signals include a pulse signal having a first current level (e.g., 3 milliamps (mA)) and a sustain signal following the pulse signal and having a second current level (e.g., 100 microamperes (μA)). A control terminal of the transistor in the latch circuit 407 is turned on when receiving the current signal of the pulse signal. After that, the conduction state of the transistor is maintained by the current signal of the sustain signal. When the current signal is zero current, the transistor is not turned on. In other words, the transistor in the latch circuit is turned on in the presence of a current, and may output a voltage signal at a logic high level; the transistor in the latch circuit is not turned on in the absence of a current, and may output a voltage signal at a logic low level, accordingly achieving the effect of a latch circuit with low power consumption.

A determination logic 413 includes a logic gate 4131, a first delay circuit 4132, a second delay circuit 4133, and a latch control circuit 4134. The logic gate 4131 may be an AND gate. A first input terminal of the logic gate 4131 and an input terminal of the first delay circuit 4132 are coupled to the control terminal of the transistor 4071 of the latch circuit 407, the control terminal of the transistor 4072, the first terminal of the transistor 4073, and an output terminal of the high-voltage P-type transistor 4051. The first input terminal of the logic gate 4131 and the input terminal of the first delay circuit 4132 may receive the first square-wave signal LV_SNS0 generated by the latch circuit 407 according to the first indication signal LV_IN. A second input terminal of the logic gate 4131 and an input terminal of the second delay circuit 4133 are coupled to the second terminal of the transistor 4071 of the latch circuit 407, the first terminal of the transistor 4072, the control terminal of the transistor 4073, and an output terminal of the high-voltage P-type transistor 4061. The second input terminal of the logic gate 4131 and the input terminal of the second delay circuit 4133 may receive the second square-wave signal LV_SNS0B generated by the latch circuit 407 according to the second indication signal LV_INB. The logic gate 4131 may generate a block signal SRBLK according to the first square-wave signal LV_SNS0 and the second square-wave signal LV_SNS0B, and provide the block signal SRBLK from an output terminal to the latch control circuit 4134. An output terminal of the first delay circuit 4132 may output a delayed first square-wave signal LV_SNS0 to the latch control circuit 4134. An output terminal of the second delay circuit 4133 may output a delayed second square-wave signal LV_SNS0B to the latch control circuit 4134. The latch control circuit 4134 may generate the low-voltage signal LV_OUT to a low-voltage output terminal 417 according to the first square-wave signal LV_SNS0, the second square-wave signal LV_SNS0B, and the block signal SRBLK. The low-voltage output terminal 417 may also be coupled to a rear-end logic circuit, which is not limited by the disclosure.

In addition, in an embodiment, the sensing protection control circuit 412 may be configured to receive a control signal sent by an external system under special circumstances, and turn off the transistor 4074 to lock the output of the latch circuit 407.

Figure 5:
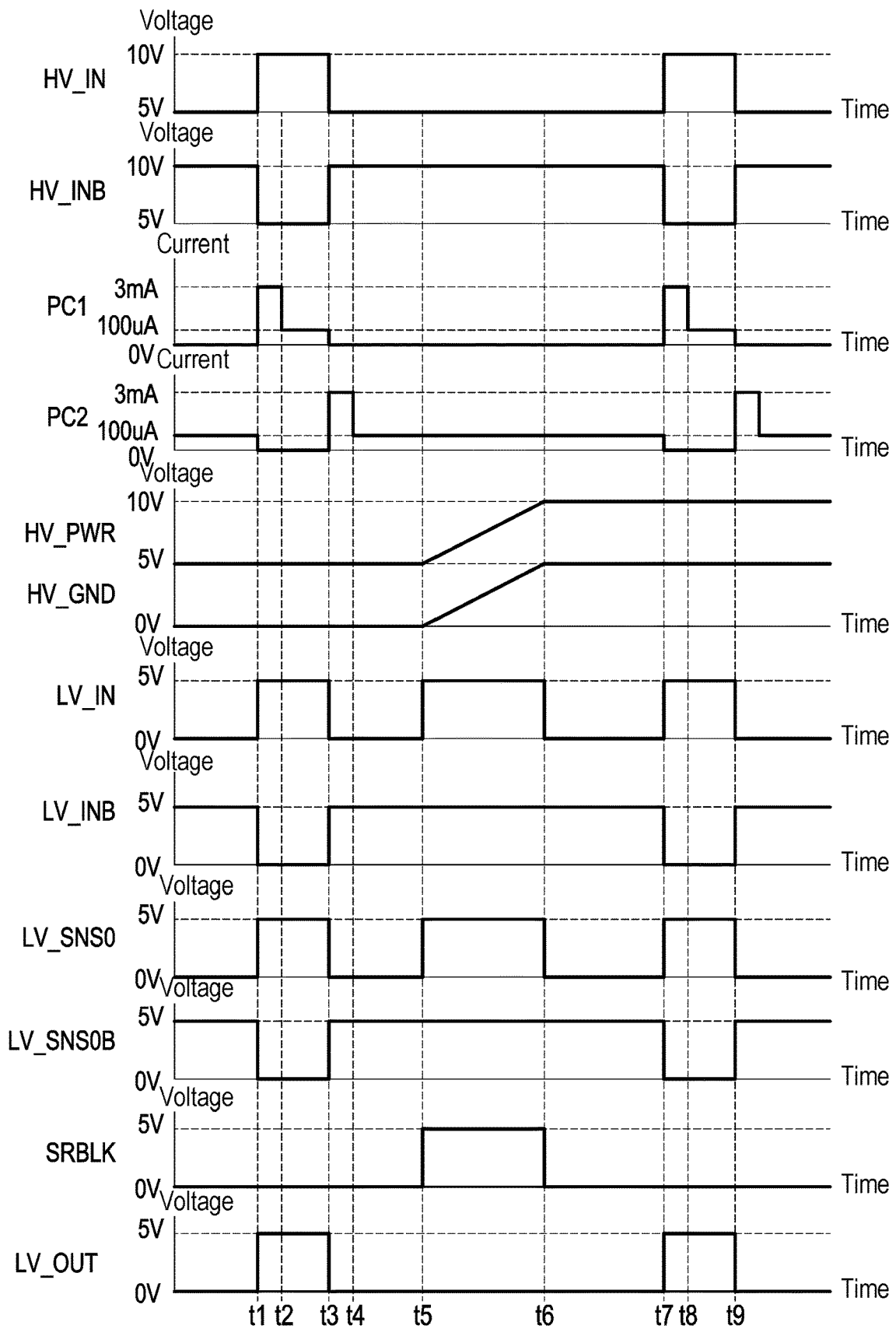
FIG. 5 is a signal signal diagram of voltage signals and current signals of an embodiment of the disclosure.

FIG. 5 is a signal signal diagram of voltage signals and current signals of an embodiment of the disclosure. With reference to FIG. 4 and FIG. 5 together, the signal changes of voltage signals and current signals in FIG. 5 are taken as an example in the description below. Before time t1, the high-voltage signal HV_IN is at a low voltage level (e.g., 5 volts (V)). The first pulse generator 403 continuously generates the first input signal PC1 having a zero current level (e.g., 0 A). The second pulse generator 404 continuously generates the second input signal PC2 including the sustain signal having a low current level (e.g., 100 μA). At this time, the transistors 4071, 4073, 4074 are turned on, and the transistor 4072 is turned off. The second terminal of the high-voltage P-type transistor 4051 of the first level shifter 405 continuously outputs the first indication signal LV_IN having a low voltage level (e.g., 0V). The second terminal of the high-voltage P-type transistor 4061 of the second level shifter 406 continuously outputs the second indication signal LV_INB having a high voltage level (e.g., 5V). As such, the latch circuit 407 outputs the first square-wave signal LV_SNS0 corresponding to a logic low level (e.g., 0V) and the second square-wave signal LV_SNS0B corresponding to a logic high level (e.g., 5V). The logic gate 4131 outputs the block signal SRBLK at a logic low level (e.g., 0V). Accordingly, the latch control circuit 4134 may output the low-voltage signal LV_OUT having a low voltage level (e.g., 0V).

At time t1, the high-voltage signal HV_IN is at a high voltage level (e.g., 10V). The first pulse generator 403 provides the first input signal PC1 of a pulse signal having a high current level (e.g., 3 mA) according to rising edge triggering of the high-voltage signal HV_IN. The second pulse generator 404 provides the second input signal PC2 having a zero current level (e.g., OA) (i.e., stops output a current signal) according to falling edge of the inverted high-voltage signal HV_INB. The second input signal PC2 is cut off according to the falling edge of the inverted high-voltage signal HV_INB (i.e., cut off according to the rising edge of the high-voltage signal HV_IN). At this time, the transistor 4071 is turned off, and the transistor 4072 is turned on. The second terminal of the high-voltage P-type transistor 4051 of the first level shifter 405 outputs the first indication signal LV_IN having a high voltage level (e.g., 5V). The second terminal output of the high-voltage P-type transistor 4061 of the second level shifter 406 outputs the second indication signal LV_INB having a low voltage level (e.g., 0V). As such, the latch circuit 407 outputs the first square-wave signal LV_SNS0 corresponding to a logic high level (e.g., 5V) and the second square-wave signal LV_SNS0B corresponding to a logic low level (e.g., 0V). The logic gate 4131 continuously outputs the block signal SRBLK at a logic low level (e.g., 0V). Accordingly, the latch control circuit 4134 may output the low-voltage signal LV_OUT having a high voltage level (e.g., 5V) according to the first square-wave signal LV_SNS0 and the second square-wave signal LV_SNS0B delayed for nanoseconds (ns) by the first delay circuit 4132 and the second delay circuit 4133 being leading edge-triggered.

At time t2, the first pulse generator 403 provides a sustain signal following the pulse signal and having a low current level (e.g., 100 μA) of the first input signal PC1 to maintain the transistors 4071 to 4073 of the latch circuit 407 to be turned on, so that the latch circuit 407 maintains outputting the first square-wave signal LV_SNS0 corresponding to a logic high level (e.g., 5V). As such, the circuit power consumption can be effectively reduced, and the latch circuit 407 can also be kept in a locked state. In addition, under the premise of ensuring and maintaining the transistor to be turned on, the high current level can be ten times or more higher than the low current level.

At time t3, since the high-voltage signal HV_IN is converted into a low voltage level (e.g., 5V), the first pulse generator 403 generates the first input signal PC1 having a zero current level (e.g., 0 A). The first input signal PC1 is cut off according to the falling edge of the high-voltage signal HV_IN. Moreover, the second pulse generator 404 may provide the second input signal PC2 of a pulse signal having a high current level (e.g., 3 mA) according to rising edge triggering of the inverted high-voltage signal HV_INB (i.e., falling edge of the high-voltage signal HV_IN). At this time, the transistors 4071 and 4074 are turned on, and the transistor 4072 is turned off. The second terminal of the high-voltage P-type transistor 4051 of the first level shifter 405 output the first indication signal LV_IN having a low voltage level (e.g., 0V). The second terminal of the high-voltage P-type transistor 4061 of the second level shifter 406 outputs the second indication signal LV_INB having a high voltage level (e.g., 5V). As such, the latch circuit 407 outputs the first square-wave signal LV_SNS0 corresponding to a logic low level (e.g., 0V) and the second square-wave signal LV_SNS0B corresponding to a logic high level (e.g., 5V). The logic gate 4131 continuously outputs the block signal SRBLK at a logic low level (e.g., 0V). Accordingly, the latch control circuit 4134 may output the low-voltage signal LV_OUT having a low voltage level (such as 0V) according to the first square-wave signal LV_SNS0 and the second square-wave signal LV_SNS0B not delayed by the first delay circuit 4132 and the second delay circuit 4133 being leading edge-triggered.

At time t4, the second pulse generator 404 provides a sustain signal following the pulse signal and having a low current level (e.g., 100 μA) of the second input signal PC2 to maintain the state of the transistors 4071 to 4073 of the latch circuit 407, so that the latch circuit 407 maintains outputting the second square-wave signal LV_SNS0B corresponding to a logic high level (e.g., 5V). As such, the circuit power consumption can be effectively reduced, and the latch circuit 407 can also be kept in a locked state.

In other words, the pulse signal and the sustain signal of the first input signal PC1 occur during a period of the high-voltage signal HV_IN is at a high voltage level (e.g., 10V), and the first input signal PC1 having a zero current level (e.g., 0 A) during a period of the high-voltage signal HV_IN is at a low voltage level (e.g., 5V). The pulse signal and the sustain signal of the second input signal PC2 occur during a period of the high-voltage signal HV_IN is at a low voltage level (e.g., 5V) (i.e., the period when the inverted high-voltage signal HV_INB is at a high voltage level (e.g., 10 V)), and the second input signal PC2 having a zero current level (e.g., OA) during a period of the high-voltage signal HV_IN is at a high voltage level (e.g., 10 V) (i.e., the period when the inverted high-voltage signal HV_INB is at a low voltage level (e.g., 5V)). In addition, a duration of the pulse signal of the first input signal PC1 and the second input signal PC2 may be 10% to 20% of a time length of a duty cycle of the high-voltage signal HV_IN.

Between time t5 and time t6, since a high-voltage power HV_PWR and the high-voltage ground signal HV_GND rise, a current IC1, generated by parasitic capacitances 4052 and 4062 between the control terminals and the second terminals of the high-voltage P-type transistors 4051 and 4061 based on charge sharing, forms the first and second indication signals LV_IN and LV_INB at a high level to be provided to the latch circuit 407, so that the latch circuit 407 outputs the first square-wave signal LV_SNS0 corresponding to a logic high level (e.g., 5V) and continuously output the second square-wave signal LV_SNS0B corresponding to a logic high level (e.g., 5V). As such, the logic gate 4131 switches to outputting the block signal SRBLK at a logic high level (e.g., 5V). Accordingly, the latch control circuit 4134 may lock the output of the latch control circuit 4134 according to the block signal SRBLK to maintain outputting the low-voltage signal LV_OUT at a low voltage level (e.g., 0V), without being affected by the currents IC1 and IC2.

At time t6, since the high-voltage power HV_PWR and the high-voltage ground signal HV_GND stop rising, the respective parasitic capacitances 4052 and 4062 of the high-voltage P-type transistors 4051 and 4061 stop transmitting the currents IC1 and IC2, so that the on-resistance of the transistor 4073 is lower than that of the transistor 4072. As such, the voltage level of the first square-wave signal LV_SNS0 is pulled down by the transistor 4073, and turns from a logic high level (e.g., 5V) to a logic low level (e.g., 0V). The logic gate 4131 switches to outputting the block signal SRBLK at a logic low level (e.g., 0V) to unlock the output of the latch control circuit 4134. The latch control circuit 4134 outputs the low-voltage signal LV_OUT having a low voltage level (e.g., 0V) according to the first square-wave signal LV_SNS0 corresponding to a logic low level (e.g., 0V) and the second square-wave signal LV_SNS0B corresponding to a logic high level (e.g., 5V). In addition, the signal changes and circuit operations from time t7 to time t9 are the same as those described in the examples above of time t1 to time t3, and will thus not be repeatedly described here.

In summary of the foregoing, according to the embodiments of the disclosure, the level shifter circuit may generate two input signals including a pulse signal and a sustain signal through two pulse generators to reduce power consumption, and may generate two corresponding indication signals for the determination circuit to accordingly generate a correct and stable low-voltage signal. The level shifter circuit of an embodiment of the disclosure is not likely to be affected by changes in the high-voltage ground signal and the high-voltage power.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A level shifter circuit of a driving device, configured to convert a high-voltage signal into a low-voltage signal, the level shifter circuit comprising:
    a first pulse generator providing a first input signal according to the high-voltage signal, wherein the first input signal comprises a pulse signal having a first current level and a sustain signal following the pulse signal and having a second current level, and the first current level is higher than the second current level;
    a first level shifter coupled to the first pulse generator, and receiving the first input signal to generate a first indication signal;
    a second pulse generator providing a second input signal according to the high-voltage signal, wherein the second input signal comprises the pulse signal and the sustain signal following the pulse signal;
    a second level shifter coupled to the second pulse generator, and receiving the second input signal to generate a second indication signal; and
    a determination circuit coupled to the first level shifter and the second level shifter, and generating the low-voltage signal according to the first indication signal and the second indication signal,
    wherein the sustain signal of the first input signal is cut off according to a falling edge of the high-voltage signal, and the sustain signal of the second input signal is cut off according to a rising edge of the high-voltage signal.

2. The level shifter circuit according to claim 1, wherein the pulse signal and the sustain signal of the first input signal occur during a period corresponding to when the high-voltage signal is at a high voltage level.

3. The level shifter circuit according to claim 1, wherein the pulse signal and the sustain signal of the second input signal occur during a period corresponding to when the high-voltage signal is at a low voltage level.

4. The level shifter circuit according to claim 1, wherein the first current level is ten times or more higher than the second current level.

5. The level shifter circuit according to claim 1, wherein a duration of the pulse signal of the first input signal and the second input signal is 10% to 20% of a time length of a duty cycle of the high-voltage signal.

6. The level shifter circuit according to claim 1, wherein the determination circuit comprises:
    a latch circuit coupled to the first level shifter and the second level shifter, and generating a first square-wave signal and a second square-wave signal according to the first indication signal and the second indication signal; and
    a determination logic coupled to the latch circuit, and generating the low-voltage output signal according to the first square-wave signal and the second square-wave signal.

7. The level shifter circuit according to claim 6, further comprising a diode, wherein a first terminal of the diode is coupled to the latch circuit, and a second terminal of the diode is coupled to the second level shifter.

8. The level shifter circuit according to claim 6, wherein the determination logic comprises:
    a logic gate receiving the first square-wave signal and the second square-wave signal, and accordingly generating a block signal; and
    a latch control circuit generating the low-voltage signal according to the first square-wave signal, the second square-wave signal, and the block signal.

9. The level shifter circuit according to claim 6, wherein the determination logic further comprises:
    a first delay circuit and a second delay circuit respectively receiving the first square-wave signal and the second square-wave signal and generating a delayed first square-wave signal and a delayed second square-wave signal, wherein the determination logic generates the low-voltage signal according to the delayed first square-wave signal and the delayed second square-wave signal.

10. The level shifter circuit according to claim 1, wherein the driving device receives a pulse width modulation signal and generates a driving signal, and the driving device further comprises:
- a logic unit receiving the pulse width modulation signal and generates a logic output signal;
- a driving signal level shifter circuit coupled to the logic unit, receiving the logic output signal, and converting the logic output signal from a low voltage domain into a high voltage domain;
- a first driver coupled to the driving signal level shifter circuit, and generating the driving signal according to the logic output signal in the high voltage domain; and
- the level shifter circuit coupled between the first driver and the logic unit, obtaining the high-voltage signal according to the driving signal, and converting the high-voltage signal into the low-voltage signal.

* * * * *